(12) United States Patent
Nakada et al.

(10) Patent No.: US 7,642,468 B2
(45) Date of Patent: Jan. 5, 2010

(54) MULTILAYER WIRING BOARD AND FABRICATING METHOD OF THE SAME

(75) Inventors: Masakazu Nakada, Aichi (JP); Minoru Ogawa, Gifu (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/458,178

(22) Filed: Jul. 18, 2006

(65) Prior Publication Data

US 2006/0274510 A1    Dec. 7, 2006

(30) Foreign Application Priority Data

Nov. 9, 2004    (JP)    ............ P2004-325259
Jul. 22, 2005    (JP)    ............ P2005-212570

(51) Int. Cl.
*H05K 1/11* (2006.01)
*H01R 12/04* (2006.01)

(52) U.S. Cl. ...................... 174/262; 174/264
(58) Field of Classification Search .......... 174/262–266
See application file for complete search history.

(56) References Cited

U.S. PATENT DOCUMENTS

| | | | |
|---|---|---|---|
| 6,694,613 B2 * | 2/2004 | Nakamura et al. ............ 29/846 |
| 6,713,687 B2 * | 3/2004 | Yazaki et al. ............... 174/263 |
| 6,768,061 B2 * | 7/2004 | Kondo ......................... 174/255 |
| 6,774,316 B1 * | 8/2004 | Suzuki et al. ............... 174/262 |
| 6,889,433 B1 * | 5/2005 | Enomoto et al. ............. 29/852 |
| 6,940,024 B2 * | 9/2005 | Watanabe ................... 174/261 |
| 7,125,810 B2 * | 10/2006 | Muta et al. ................. 438/758 |
| 2004/0156583 A1 * | 8/2004 | Totani et al. ................. 385/24 |

* cited by examiner

*Primary Examiner*—Ishwar (I. B.) Patel
(74) *Attorney, Agent, or Firm*—Sonnenschein Nath & Rosenthal LLP

(57) ABSTRACT

To improve reliability of interlayer connection of a multilayer wiring board. Plural metal conductor pattern layers are formed on a base material made of thermoplastic resin. Then, high melting metal containing copper, low melting metal containing tin, and binder resin are packed into a via hole. Subsequently, predetermined heat and pressure are applied. Then, while half-melted metal mixture droplets of the low and high melting metals and melted binder resin are phase separated from each other, the surfaces of the conductor patterns that face the openings of the via and the low melting metal are alloyed with each other to form an alloy layer as well as the high and low meting metals are alloyed with each other to form a columnar-shaped interlayer connection part. As a result, an intermediate layer is formed between the outer surface of the columnar-shaped interlayer connection part and inner surface of the via hole.

12 Claims, 5 Drawing Sheets

Prior Art

MULTILAYER WIRING BOARD AND FABRICATING METHOD OF THE SAME

CROSS REFERENCE TO RELATED APPLICATIONS

The present invention contains subject matter related to Japanese Patent Applications JP 2004-325259 and JP 2005-212570 filed in Japanese Patent Office on Nov. 9, 2004, and Jul. 22, 2005, the entire contents of which being incorporated herein by reference.

BACKGROUND OF THE INVENTION

1. Field of the Invention

The present invention relates to a multilayer wiring board in which a plurality of metal conductor pattern layers are formed on a base material made of a thermoplastic resin and a method of fabricating the same.

2. Description of the Related Art

Along with the widespread use of portable electronic devices such as a mobile phone, a digital still camera, build-up boards have come to the forefront in the market. The build-up boards are designed to realize ultra-miniaturization of components as well as a fine pattern or miniaturization of via hole sizes for high-density implementation. However, the build-up board is produced based on so-called a sequential multilayer wiring technology in which respective layers are sequentially formed and laminated, complicating a board fabrication process.

Under the circumstance, a method that has been applied to a ceramic multilayer board using a green sheet is now being applied also to an organic material. In this method, via holes, wiring patterns, and the like are previously formed for each layer and are positioned between layers, followed by a batch lamination process.

As the organic base material, a thermoplastic resin is very useful. The reason is as follows. A wiring board made of a thermoplastic resin does not have to be subjected to vacuum hot press for a long time for removal of voids contained in the base material or resin hardening, which is necessary in the case of a glass-fiber reinforced thermoset resin such as a widely used glass epoxy, and bonding between the base material and conductor pattern by heat allows batch lamination process in a short period of time and following integration process. As a result, it is possible to obtain a multilayer structure in a simpler manner. Further, it is possible to select a base material excellent in high-frequency characteristics such as dielectric constant.

As a technique that can be applied to interlayer connection of a wiring in a batch-fabricated multilayer, there is available a technique for obtaining electrical connection by filling via holes with a metal paste. For example, Japanese Patent No. 3473601 discloses such a technique. In this technique disclosed in Japanese Patent No. 3473601, via holes formed in a thermoplastic resin material on which wiring patterns are formed are filled with tin which is a low melting metal and alloyed with a metal forming a conductor pattern and silver powder which is a high melting metal having a melting point higher than the heat-application temperature at the time of interlayer connection to establish electrical connection between the conductor patterns through an alloy layer of the metal forming the conductor pattern under heating and pressurization processes and tin contained in a conductive composition obtained by sintering. As described above, in this technique, electrical connection between conductor patterns is made by means of conductive compositions.

The electrical connection between conductor patterns is not made by electrical connection process in the above connection method, so that an interlayer connection resistance is unlikely to change, preventing the reliability of the interlayer connection from being lowered.

In the alloying process, as shown in a schematic view of FIG. 1, heat is applied at a temperature at which a low melting metal particle 101 packed in a via hole formed in a base material 100 is melt to induce alloying between the melted low melting metal and a high melting metal 102 in a sequential manner starting from the interface of the high melting metal 102. As a result of the alloying process between the low melting metal particle 101 and high melting metal particle 102, an alloy (intermetallics) 103 is formed between the metal particles. So-called sintering occurs. At this time, at the interface between a metal wiring pattern 104 and the alloy 103, an alloy (intermetallics) layer 105 of the wiring pattern and low melting metal is formed, thus connecting the metal wiring patterns 104 between layers.

The alloys 103 and 105 have a high melting point, so that even when a temperature as high as 250° C. or more, which is necessary for soldering, is applied, a conductive composition is not melted and the strength thereof can be maintained. For example, if silver (melting point: 961° C.) is used as a high melting metal and tin (melting point: 232° C.) is used as a low melting metal in the technique disclosed in Japanese Patent No. 3473601, an obtained alloy of the silver and tin has a melting point of 480° C., thus increasing the melting point. The formation of the alloys (intermetallics) 103 and 105 allows enough strength to resist a heat treatment process performed at the soldering time in the post-process to be sufficiently secured.

SUMMARY OF THE INVENTION

In the above connection mechanism, however, the following problem may arise at the conductive composition formation time by sintering.

As shown in FIG. 2, the low melting metal particle 101 extends through wetting to the surface of the high-melting metal particle 102 to thereby form the alloy (intermetallics) 103. The high melting metal particle 102 hardly moves in a via hole at the melting temperature of the low melting metal particle 101 but the melted low melting metal particle 101 is moved to the surface of the high melting metal particle 102. Accordingly, there is more likely that voids existing between the metal particles before heating collect together to form a blowhole or a larger void around within the via hole than a state before melting. Particularly, when via voids are intended to be compressed and removed by pressurization at the press time in a temperature higher than the melting point of the low melting metal particle 101, contact between the metal particles 101 and 102 allows rapid progress of alloying starting from the connection point between them. The generated alloy (intermetallics) 103 has a melting point significantly higher than the melting/bonding temperature of the base material 100. Therefore, it is not possible to re-melt the alloy 103 for compression, with the result that voids remain in the via metal. If compression is continued in such a case, the connection site itself may be subjected to buckling to affect the connection process.

If the level of the generated alloy is higher than the level of that obtained after melting and bonding of the base material, the conductor pattern is not able to sink into the base material but serves as a via column to prevent the bonding of the base material. If compression is continued in such a state, a pattern formed in the vicinity of via holes may be broken to generate cracks.

In order to prevent this, it is necessary to gradually increase the heating temperature starting from the melting point of the low melting metal during the heating and compression for the alloying process. However, this method takes a long time, failing to take advantage of the properties of the thermoplastic resin that melting and boding lamination process can be done at short times. As a result, productivity decreases to increase cost.

Further, in sintering process, a reduction in the metal particle size is necessary in order to reduce the number of voids in the alloy. However, filling density increases as the particle size is reduced to increase the friction force between particles at the compression time, so that it becomes difficult to apply a uniform molding pressure to each site of the via holes, causing difficulty in obtaining uniform via alloy and resulting in insufficient alloy formation between the metal wiring pattern and low meting metal. This phenomenon becomes prominent as the via hole diameter becomes smaller, bringing about disadvantage in a fabrication of high-density board.

The present invention has been made to solve the above problems, and it is desirable to provide a multilayer wiring board in which a plurality of metal conductor pattern layers are formed on a base material made of a thermoplastic resin and a method of fabricating the same capable of improving the reliability of interlayer connection.

According to an embodiment of the present invention, there is provided a multilayer wiring board in which a plurality of metal conductor pattern layers are formed on an insulating base material made of a thermoplastic resin, wherein a metal containing at least copper, which has a melting point higher than the melting/bonding temperature of the base material, a metal containing at least tin, which can be alloyed with the conductor pattern and which has a melting point lower than the melting/bonding temperature of the base material, and a binder resin which is melted at a temperature not higher than the melting/bonding temperature of the base material are packed into a via hole formed in the base material, and heat is applied at the melting/bonding temperature of the base material and a predetermined pressure is applied to the multilayer wiring board in which conductor patterns have been formed at the upper and lower openings of the via holes, and then while liquefied low melting metal and melted binder resin are phase separated from each other, the surfaces of the conductor patterns that face the openings of the via and the low melting metal are alloyed with each other as well as the low melting metal and high melting metal are alloyed with each other to thereby establish interlayer electrical connection between the conductor patterns.

Further, according to an embodiment of the present invention, there is provided a method for fabricating a multilayer wiring board in which a plurality of metal conductor pattern layers are formed on an insulating base material made of a thermoplastic resin, which includes a first step of packing a metal containing at least copper, which has a melting point higher than the melting/bonding temperature of the base material, a metal containing at least tin, which can be alloyed with the conductor pattern and which has a melting point lower than the melting/bonding temperature of the base material, and a binder resin which is melted at a temperature not higher than the melting/bonding temperature of the base material into a via hole formed in the base material, and a second step of applying heat at the melting/bonding temperature of the base material and applying a predetermined pressure to the multilayer wiring board in which conductor patterns have been formed at the upper and lower openings of the via holes, and then while liquefied low melting metal and melted binder resin are phase separated from each other, alloying the surfaces of the conductor patterns that face the openings of the via and the low melting metal with each other as well as alloying the low melting metal and high melting metal with each other to thereby establish interlayer electrical connection between the conductor patterns.

Further, according to an embodiment of the present invention, there is provided a multilayer wiring board in which a plurality of metal conductor pattern layers are formed on an insulating base material made of a thermoplastic resin and interlayer electrical connection between the metal conductors are established by a via hole penetrating the base materials, wherein a metal containing at least an alloy of tin and copper, which is formed in the via hole, connects the conductor patterns formed on the upper and lower openings of the via holes, and a binder resin layer is formed between the outer circumference of the interlayer connection metal and inner surface of the via hole.

In the multilayer wiring board, existence of the binder resin prevents a direct contact between the low melting metal and high melting metal when no pressure is applied even at a temperature higher than the melting point of the low melting metal to prevent alloying between them. Simply by applying a predetermined pressure at the time point when the temperature reaches the melting/bonding temperature of the base material, the binder resin flows to thereby bring the low melting metal and high melting metal into contact with each other. However, even at this time point, existence of the melted binder resin allows the liquefied low melting metal and high melting metal to flow in the via hole. The liquefied low melting metal and high melting metal are then locally mixed to become half-melted metal mixture droplets. This state continues until a high melting alloy is formed. That is, the metal mixture droplets are melted together in the melted binder resin and, at the same time, phase separated from the melted binder resin, as oil droplets suspended in water become mass together and phase separated from the water. The metal mixture droplets contain tin to be alloyed with the conductor pattern, so that they gather around the upper and lower conductor patterns having a high wet property, and are melted together. At this time point, the metal mixture droplets are formed into a columnar shape while being alloyed with the upper and lower conductor patterns and connected thereto. The binder resin is positioned between the outer surface of the columnar shaped half-melted metal mixture and inner surface of the via hole. After heat and pressure application step has been continued for a sufficient time, the heat and pressure application is stopped to bring temperature and pressure to a normal level.

Consequently, the half-melted metal mixture formed into a columnar shape in the via hole has been alloyed to become the interlayer connection part which includes an alloy $Cu_6Sn_5$ (melting point: 630° C.) of copper and tin and whose melting point has been increased. The interlayer connection part is alloyed with the upper and lower conductor patterns and thereby connected thereto through the alloy layers. As a result, the conductor patterns formed on the upper and lower surfaces of the base material are electrically connected to each other to thereby achieve interlayer connection. Further, the binder resin in the form of a solid exists between the outer surface of the interlayer connection part and inner surface of the via hole to form the intermediate layer.

With the interlayer connection mechanism, it is possible to prevent the abovementioned problem that blow hole is generated in the alloy even in a rapid alloying process by going through liquid-liquid phase separation between the melted low melting metal and melted binder resin.

Further, in such interlayer connection, the binder resin can act as a lubricant between particles even if metal particles are minute scales and has therefore plasticity like clay to apply uniform pressure to the entire via hole. Accordingly, the low melting metal and high melting metal in the via are uniformly brought into contact with each other to make the structure of the alloy in the via hole uniform.

In the fabrication method according to an embodiment of the present invention, a metal wiring pattern is previously formed on a base material made of a thermoplastic resin; a high melting metal which is a metal containing at least copper (melting point: 1083° C.), a low melting metal (tin or alloy containing tin) which can be alloyed with the wiring pattern and high melting metal, and binder resin which exists around the low melting metal particles and which is melted at the melting/bonding temperature of the base material are packed into a via hole formed in the base material; conductor patterns are formed at the upper and lower opening of the via hole; and heat is applied at the base material melting/bonding temperature which is higher than the melting point of the low melting metal and a predetermined pressure is applied.

After a liquid-liquid phase separation between the liquefied low melting metal and melted binder resin, the surfaces of the conductor patterns that face the openings of the via and the low melting metal are alloyed with each other while the low melting metal and high melting metal are alloyed with each other to thereby establish interlayer electrical connection between the conductor patterns formed on both surfaces of the base material.

Further, existence of the binder resin makes the structure of the alloy in the via hole uniform. As a result, it is possible to obtain a multilayer wiring board having high connection stability.

DETAILED DESCRIPTION OF THE PREFERRED EMBODIMENTS

An embodiment of the present invention will be described in detail with reference to the accompanying drawings.

Structure of Multilayer Wiring Board

Figure 1:
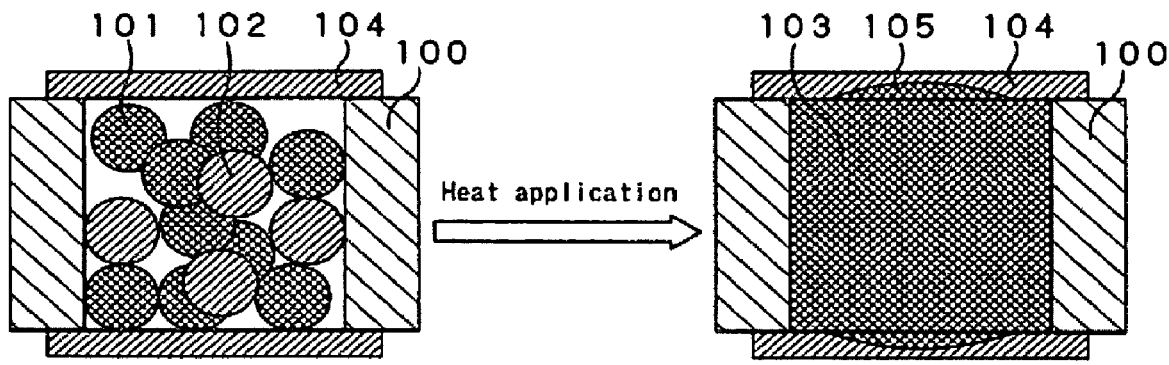
FIG. 1 is a view showing a method that fills a via hole with a high melting metal particle and low melting particle followed by heat application to form an alloy layer of the high melting metal and low melting metal so as to attain interlayer connection.
Figure 2:
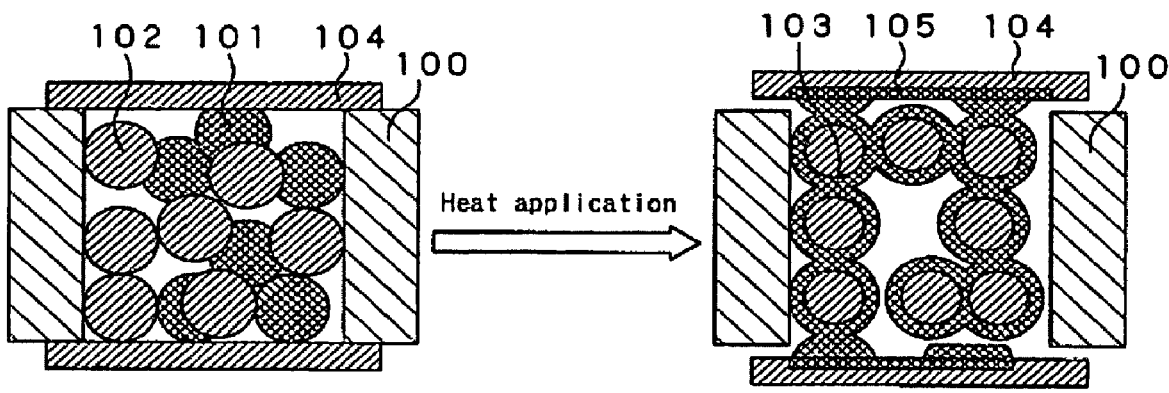
FIG. 2 is a view schematically showing the inside of a via hole in the case of using only metal particles (without use of binder resin)
Figure 3:
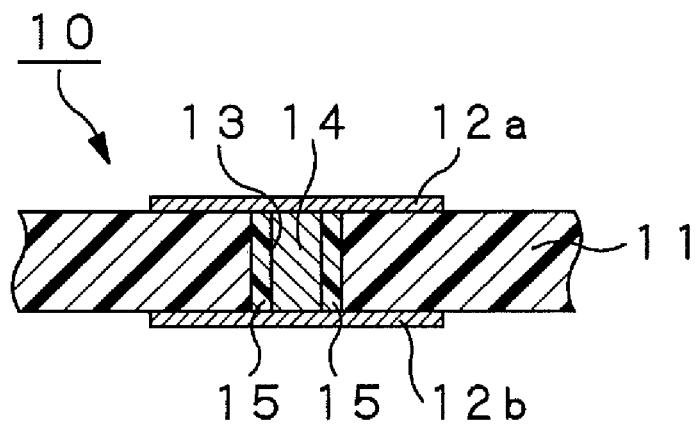
FIG. 3 is a view schematically showing the cross-section of a multilayer wiring board according to an embodiment of the present invention.

FIG. 3 is a view schematically showing the cross-section of a multilayer wiring board 10 according to an embodiment of the present invention.

As shown in FIG. 3, the multilayer wiring board 10 includes a base material 11 and metal conductor patterns 12 (12a, 12b) formed on both sides (upper and lower surfaces) of the base material 11. A via hole 13 penetrating the base material 11 from the upper surface to lower surface thereof is formed in the base material 11. An interlayer connection part 14 is formed in the via hole 13. The upper and lower openings of the via hole 13 are covered by the conductor patterns 12 (12a, 12b). The interlayer connection part 14 is connected to the conductor patterns 12 (12a, 12b) formed on both sides of the base material 11 and electrically connects the conductor patterns 12 and base material 11, thus establishing electrical connection between layers.

The base material 11 is a thermoplastic resin film having a heat resistance necessary in a process of soldering components to the multilayer wiring board 10 and sufficient mechanical strength. The base material 11 is, e.g., a liquid crystal polymer of a wholly aromatic polyester resin. As the thermoplastic resin film, the following resins may be used singly or in mixture in addition to the liquid crystal polymer. Further, additives such as filler may be added if necessary.

Crystalline resin: polyacetal (POM: melting point 165° C.), polyamide (PA: melting point 265° C.), polybutylene terephthalate (PBT: melting point 228° C.), polyphenylene sulfide (PPS: melting point 278° C.), polyether ether ketone (PEEK: melting point 334° C.).

Amorphous resin: thermoplastic polyimide (PI), modified polyphenylene ether (m-PPE), polyamide-imide (PAI), polyether-imide (PEI), polyalylate (PAR), polysulfone (PSF), polyethersulfone (PES)

The conductor pattern 12 is a metal having a low resistance and is alloyed with tin. It is preferable to use, e.g., copper or a commonly used copper foil for printed circuit boards obtained by applying anticorrosive treatment to copper.

The interlayer connection part 14 is an alloy including at least copper and tin. Since this alloy includes $Cu_6Sn_5$ (melting point: about 630° C.) which is an alloy of copper and tin, the melting point thereof is increased and therefore the alloy can undergo soldering reflow process.

Further, in the multilayer wiring board 10, an intermediate layer 15 made of a resin that is melted at the melting/bonding temperature of the base material is formed around the inner surface of the via hole 13, i.e., between the outer surface of the interlayer connection part 14 and inner surface of the via hole 13.

Figure 4:
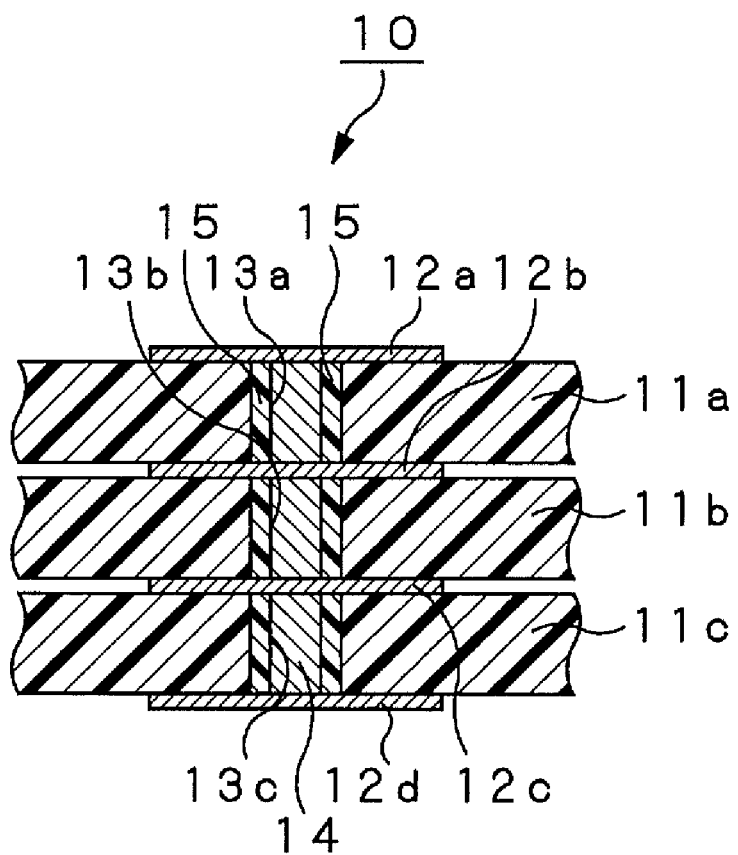
FIG. 4 is a view schematically showing the cross-section of another example of a multilayer wiring board according to the embodiment of the present invention.

The multilayer wiring board 10 according to the embodiment of the present invention may include a plurality of base materials 11. For example, as shown in FIG. 4, the multilayer wiring board 10 has a structure in which a plurality of base materials 11 (11a, 11b, 11c) are laminated as well as metal conductor patterns 12 (12a, 12b, 12c, 12d) which are formed between the base materials 11 and front and back surfaces thereof are laminated. Via holes 13 (13a, 13b, 13c) are formed in the respective base materials 11 (11a, 11b, 11c). An interlayer connection part 14 which electrically connects the conductor patterns 12 to one another is formed in the via holes 13 (13a, 13b, 13c). An intermediate layer 15 is formed on the outer wall of the interlayer connection part 14.

Fabrication Process

A fabrication process of the multilayer wiring board 10 described above will be described below.

Figure 5:
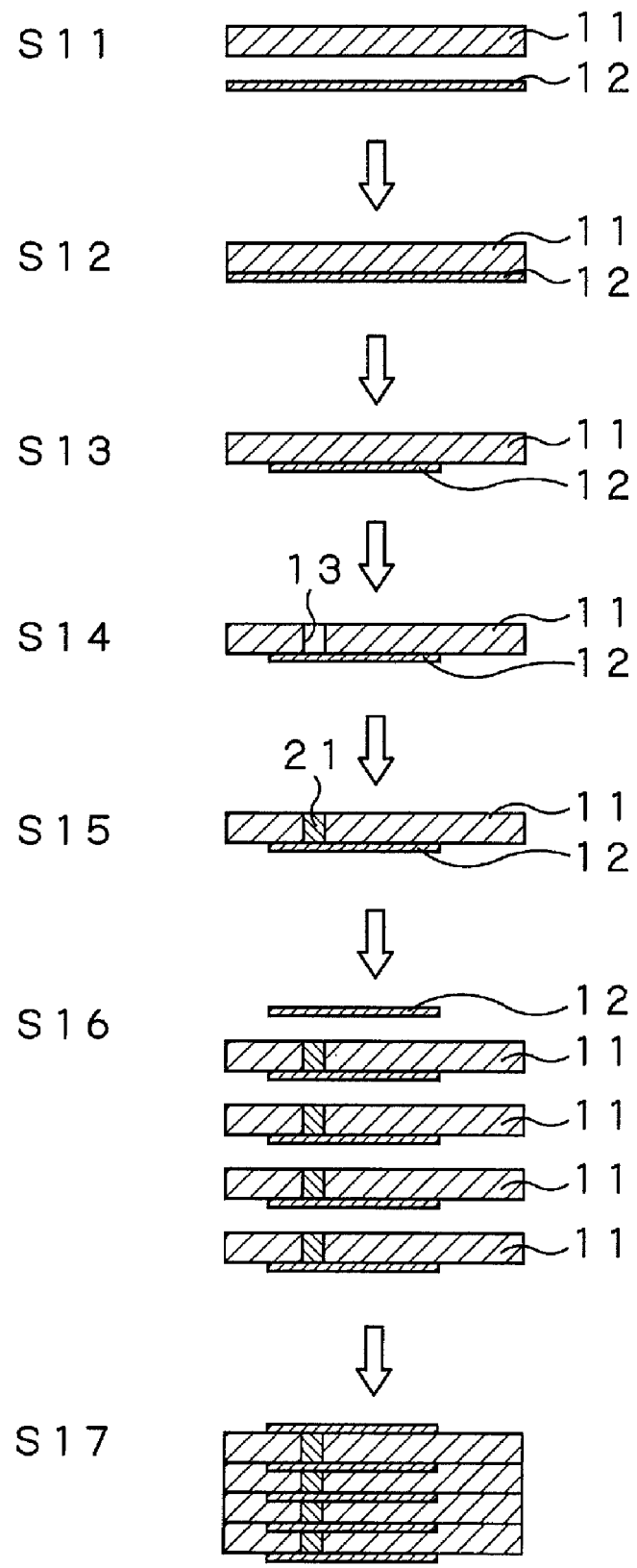
FIG. 5 is a view showing respective steps for fabricating the multilayer wiring board.

FIG. 5 is a view showing respective steps for fabricating the multilayer wiring board 10.

In the first step (S11), a copper foil serving as the conductor pattern 12 the one side or both sides of which have been roughened and an insulating thermoplastic resin film serving as the base material 11 are prepared.

In this example, the base material 11 is a liquid crystal polymer (LCP) of a wholly aromatic polyester resin having a thickness of 25 to 200 μm. However, the thermoplastic resin film has to be capable of being melted and bonded by hot press, has to have a heat resistance necessary in soldering process of components, and has to have a sufficient mechanical strength.

Subsequently, in the second step (S12), the metal foil serving as the conductor pattern 12 is bonded to one surface of the thermoplastic resin film serving as the base material 11 by heat or other connection process. In this example, a copper foil is used as the metal foil serving as the conductor pattern 12.

In the third step (S13), etching is applied to the bonded metal foil to form the conductor pattern 12.

In the fourth step (S14), carbon dioxide gas laser is irradiated on the surface of the thermoplastic resin film serving as the base material 11 on the side opposite to the surface on which the conductor pattern 12 is bonded to thereby form the via hole 13. At this time, the hole is not formed in the conductor pattern 12, but the hole is formed only in the thermoplastic resin film. Accordingly, in this state, the conductor pattern 12 serves as the bottom of the via hole 13. In addition to the carbon dioxide gas laser, UV-YAG laser, excimer laser, or the like may be used. If necessary, desmear processing may be performed for the bottom surface of the via hole 13. As the desmear processing, chemical desmear or physical desmear such as one using plasma or excimer laser may be employed.

In the fifth step (S15), the via hole 13 having the bottom which has been formed on the base material 11 is filled with a via filler 21.

The material of the via filler 21 is a mixture of high melting metal, low melting metal, and binder resin or a precursor of the binder resin.

The high melting metal is particle-size metal containing at least copper and having a melting point higher than the melting/bonding temperature of the base material 11 which is a thermoplastic resin. More specifically, the high melting metal is single-copper particles or alloy particles containing copper and one or more metal selected from among gold, silver, zinc, and nickel. The surfaces of the metal particles may be coated by plating gold, silver, zinc, or nickel. This plating may include alloy plating of gold, silver, zinc, or nickel. In this example, copper powder having the average metal particle diameter of 8 μm is used as high melting metal.

The low melting metal is tin particles or alloy (e.g., solder) particles containing tin. As the solder, a mixture of one or more solders obtained by adding one or more selected from a group of indium, zinc, bismuth to tin-copper based solder, tin-silver based solder, tin-silver-copper based solder may be used. In this example, tin powder having an average particle size of 8 μm is used. Although the low melting metal used in this example is particles, it does not have to be particles as long as it can be uniformly mixed in the via filler 21.

The low melting metal has a melting point lower than the melting/bonding temperature of the base material 11 which is a thermoplastic resin and is alloyed with the conductor pattern 12 and high melting metal particles. It is desirable that metal to be used as the conductor pattern 12 have a high wet property with the low melting metal. In this example, copper, which exhibits high wetting properties with liquefied tin and is capable of being alloyed with the same, is used as the conductor pattern 12.

The binder resin used in this example is a resin having thermoplasticity in which the melting temperature thereof is lower than the melting/bonding temperature of the base material 11 as well as resin behaving as liquid at the time when being phase separated from the melted low melting metal. The thermoplasticity mentioned here is a property that allows softening and solidification at specific high and low temperatures to be achieved in a reversible fashion. Although examples of the binder resin having such a property include typical thermoplastic resins such as polyester, polyolefin, polyacryl, polyamide, polyamide-imide, polyetherimide, polyphenylene ether, polyphenylene sulfide, polyvinyl butyral, resins which are generally considered to be a thermoplastic resin having a non-melting property, such as epoxy resin, phenoxy resin, guanamine resin, unsaturated polyester resin, alkyd resin, or diallyl phthalate resin may be used as the binder resin as long as it has liquidity at the base material melting/bonding temperature after completion of thermosetting reaction and can be liquid-liquid phase separated from the melted low melting metal. For example, resins whose degree of linking is controlled to low levels and which has thermoplasticity can be used as the binder resin. The binder resin may be in the form of paste in which it has been dissolved with an organic solvent or reactive diluent, may be coated on metal particles, or may be in the form of minute particles as long as metal particles are not allowed to be brought into direct contact with each other.

Further, it is only necessary for the binder resin to have become a thermoplastic resin at the time point when being melted and bonded to the base material, so that it may be a precursor of resin, i.e., monomer, reactive oligomer, or prepolymer of the aforementioned resins at the time of via hole filling. In this case, however, the above precursor has to be resinified through a necessary process such as heat application process before the time point when being melted and bonded to the base material. This is because that the precursor undergoes polymerization reaction or cross-linking reaction by application of heat to make the liquid viscosity thereof unstable and that a low molecular precursor is easy to vaporize to allow generation of air bubbles, thereby adversely affecting the phase separation from the low melting metal. Therefore, it is not possible to go through phase separation using a stable material such as resin.

In this example, a polyester resin is used as the binder resin. The liquefied polyester resin exhibits high wetting properties with the LCP (liquid crystal polymer of wholly aromatic polyester resin) used as the base material 11, so that the adhesiveness between the polyester resin and LCP is high. This is because that the LCP is a polymer of the same material (polyester) as the binder resin and therefore the affinity between the liquefied polyester resin and LCP is high. Further, the binder resin in the form of a solid has an elasticity lower than that of the LCP. It is preferable that the elasticity of the binder resin in the form of a solid be sufficiently lower than that of the base material 11. The reason for this will be described in detail later.

In this example, the binder resin is dissolved into butylcarbitol which is an organic solvent, and the high melting metal (copper) particle and low melting metal (tin) particle are mixed with the resultant solution to thereby obtain the via filler 21 in the form of a paste. Then, a metal mask whose opening is positioned to the via hole having a bottom is used to print and pack the paste into the via hole 13. After the resin filling, a process for drying the organic solvent is added in this example. A method using a dispenser or the like may be used for packing the paste into the via hole 13, if it can reliably be performed. The via filler 21 may be a suspension obtained by mixing the high melting metal (copper) particle and low melting metal (tin) particle in the organic solvent in which the binder resin in the form of powder has been dispersed.

Soft etching or reduction treatment may be applied to the site of the conductor patter 12 that faces the via hole 13 before the via filler 21 is packed into the via hole 13. The above processing removes oxide on the conductor pattern 12, achieving the optimal formation of an alloy layer to be described later.

In the sixth step (S17), a plurality of base materials 11 (although four base materials 11 are used in this example, the number of the base materials 11 is not limited to this) on only one surface of each of which the conductor pattern 12 has been formed are laminated to form a multilayer wiring structure such that the conductor patterns 12 are formed between the base materials 11. Further, another conductor pattern 12 is formed on the opening of the via hole 13 and etched.

In the seventh step (S17), pressure is applied vertically to the upper and lower surfaces of the multilayer wiring board 10 as well as heat is applied thereto by a vacuum heating press machine. As a result, the copper particles and low melting metal are melted. The melted low melting metal is then alloyed with the copper particles and further alloyed with the contact surface of the conductor pattern 12 to achieve interlayer connection.

A mechanism of the interlayer connection in the seventh step (S17) is as follows.

Figure 6A:
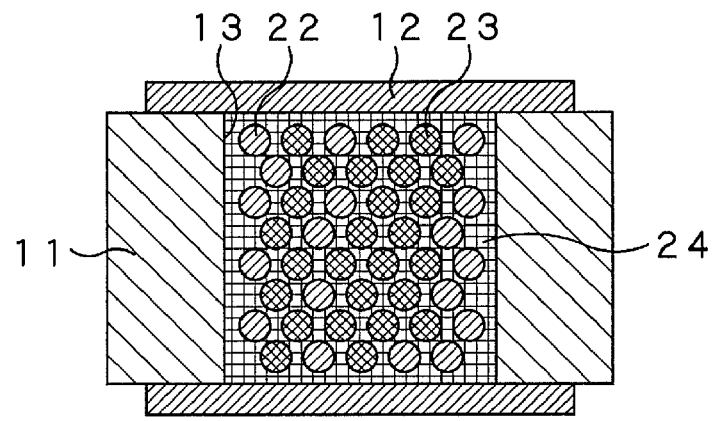
FIGS. 6A to 6D are views for explaining a mechanism of interlayer connection according to the embodiment of the present invention.

As shown in FIG. 6A, heat is applied to the multilayer wiring board 10 in a state where the via hole 13 has been filled with the via filler 21 as well as pressure is applied vertically to the upper and lower surfaces of the multilayer wiring board 10.

The heat application is carried out at a temperature higher than the melting point of the low melting metal 23 and a temperature high enough to melt and bond the base material 11 which is thermoplastic resin. In this example, a crystal liquid polymer is used as the base material 11 and applied heat is 310° C. This temperature is higher than the melting point of the low meting metal 23 (tin: 232° C.). In this state, the low melting metal has already been liquefied and the binder resin 24 (polyester resin) has been melted.

The melted binder resin 24 controls a contact between the liquefied low melting metal 23 and high melting metal 22 to prevent alloying between them. When a predetermined pressure is applied by a press in such a state, the conductor pattern 12 is sink into the base material to narrow the space in the via hole with the result that the liquefied low melting metal 23 and high melting metal 22 are brought into contact to each other. However, even at this time point, existence of the melted binder resin 24 allows the liquefied low melting metal 23 and high melting metal 22 to flow in the via hole. The liquefied low melting metal 23 and high melting metal 22 are then locally mixed to become half-melted metal mixture droplets 26. This state continues until a high melting alloy is formed. That is, the metal mixture droplets 26 are melted together in the melted binder resin 24 and, at the same time, phase separated from the melted binder resin, as oil droplets suspended in water become mass together and phase separated from the water.

Figure 6B:
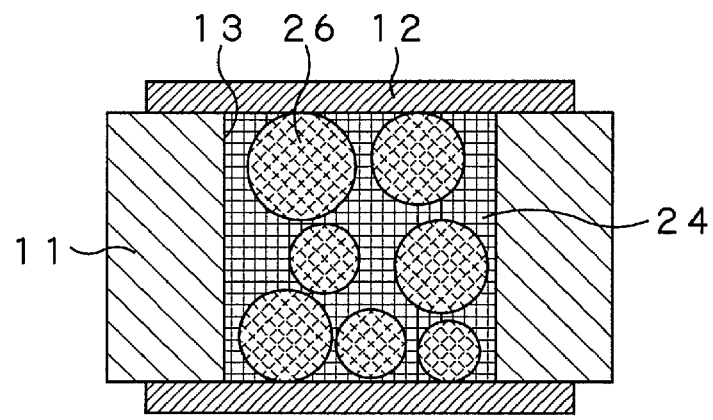

As shown in FIG. 6B, the metal mixture droplets 26 contain the low melting metal 23 to be alloyed with the conductor pattern 12, so that they gather around the upper and lower conductor patterns 12 having a high wet property, and are melted together.

Figure 6C:
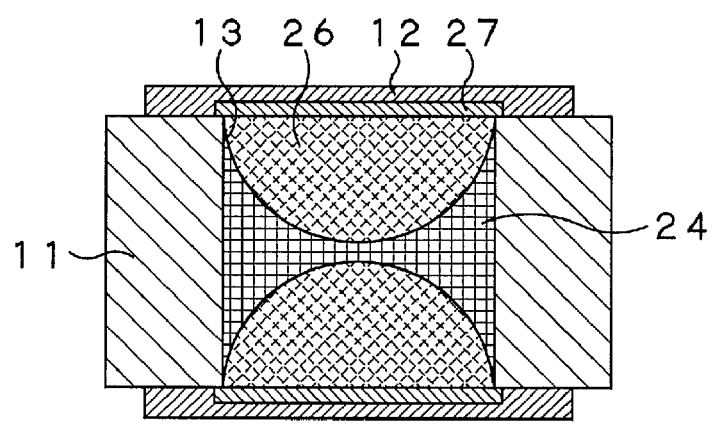

As shown in FIG. 6C, an alloy layer 27 of the conductor pattern 26 and low melting metal 23 is formed, and the melted binder resin 24 gathers between the columns of the half-melted metal mixture 26 in the via hole and base material 11.

Figure 6D:
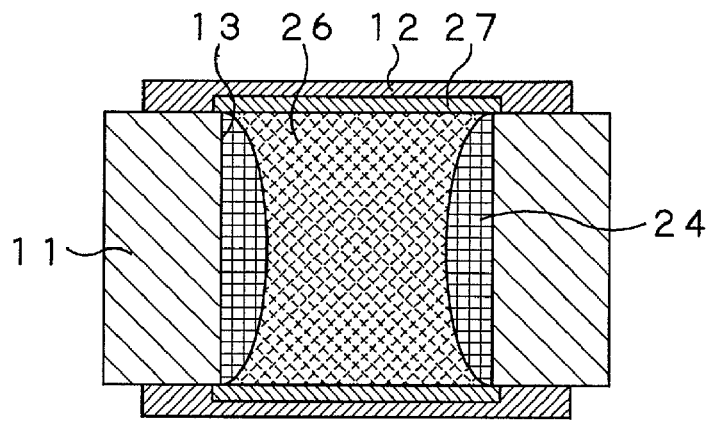

As shown in FIG. 6D, the half-melted metal mixture 26 is then formed into a columnar shape so as to connect the upper and lower conductor patterns 12. The binder resin 24 is positioned between the outer surface of the columnar shaped half-melted metal mixture 26 and inner surface of the via hole 13. After heat and pressure application step has been continued for a sufficient time, the heat and pressure application is stopped to bring temperature and pressure to a normal level.

Figure 7:
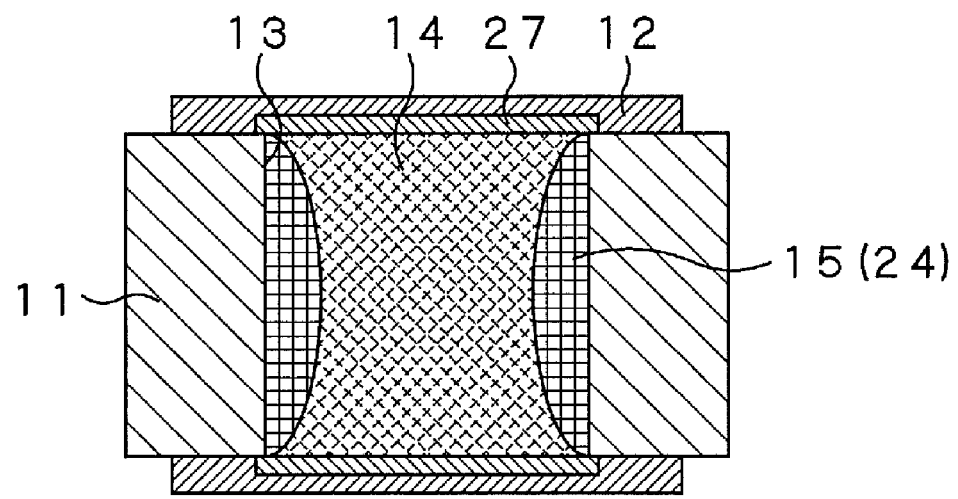
FIG. 7 is a view schematically showing the cross-section of the multilayer wiring board in which interlayer connection has been achieved by the interlayer connection mechanism.

Consequently, as shown in FIG. 7, the half-melted metal mixture formed into a columnar shape in the via hole 13 has been alloyed to become the interlayer connection part 14 which includes an alloy $Cu_6Sn_5$ (melting point: 630° C.) of copper and tin and whose melting point has been increased. The interlayer connection part 14 is alloyed with the upper and lower conductor patterns 12 and thereby connected thereto through the alloy layers 27. As a result, the conductor patterns 12 formed on the upper and lower surfaces of the base material 11 are electrically connected to each other to thereby achieve interlayer connection. Further, the binder resin 24 in the form of a solid exists between the outer surface of the interlayer connection part 14 and inner surface of the via hole 13 to form the intermediate layer 15. At that time, melting of the base material has been completed.

With the interlayer connection mechanism described above, it is possible to prevent the abovementioned problem that blow hole is generated in the alloy even in a rapid alloying process by going through liquid-liquid phase separation between the melted low melting metal 22 and melted binder resin 24.

Further, in such interlayer connection, the binder resin 24 can act as a lubricant between particles even if metal particles are minute scales and has therefore plasticity like clay to apply uniform pressure to the entire via hole. Accordingly, the low melting metal and high melting metal in the via are uniformly brought into contact with each other to make the structure of the alloy in the via hole 13 uniform. As a result, it is possible to obtain a multilayer wiring board 10 having high connection stability.

Effects, etc

As described above, the surfaces of the conductor patterns 12 formed at the upper and lower openings of the via hole 13 that face the opening of the via hole 13 and liquefied low melting metal 23 are alloyed with each other, as well as the low melting metal 23 and high melting metal 22 are alloyed with each other. As a result, interlayer electrical connection between the conductor patterns 12 formed on the upper and lower surfaces of the base material 11 can be established.

In particular, in the fabrication process according to the embodiment of the present invention, the interlayer connection part 14 and intermediate layer 15 are formed through a liquid-liquid phase separation process between the melted binder resin 24 and half-melted metal mixture 26 at the time of alloying. As a result, voids are not generated in the interlayer connection part 14 to thereby increase the reliability of connection.

It is necessary to control the amount of the binder resin and amount of tin in the metal in order to achieve the above interlayer connection.

With regard to the binder resin, it is desirable that the volume of the binder resin 24 be 0.5 volume % to 70 volume % relative to the total volume of via filler 21 containing the high melting metal 22, low melting metal 23, and binder resin 24. If falling below 0.5 volume %, the void reduction effect is not expected due to the shortage of the binder resin; on the other hand, if exceeding 70 volume %, alloy formation between metals is adversely affected.

If the amount of tin which is a metal constituting the low melting metal 23 is too small relative to the combined weight of low melting metal 23 and high melting metal 22, liquid metal component at the time of heat and pressure application becomes small, making it hard to cause liquid-liquid phase separation between the binder resin 24 and low melting metal 23; on the other hand, if the relative amount of the low melting metal 23 is too large, the penetration of the low melting metal 23 into the conductor pattern 12 becomes large due to a large amount of tin, reducing the reliability of connection. For example, in a multilayer wiring board in which the amount of the tin powder is 99 weight % and that of copper powder is 1 weight %, the interlayer connection part 14 completely penetrated the conductor pattern 12.

When controlling the weight ratio appropriately with the above point taken into consideration, it is found that it is desirable to set the amount of tin contained in the low melting metal 23 to 75 weight % to 95 weight % relative to the combined weight of the high melting metal 22 and low melting metal 23.

For example, when the amount of the tin power is set to 76 weight % and that of the copper powder is set to 24 weight %, the interlayer connection part 14 does not completely penetrate the conductor pattern 12 made of copper foil. Further, voids are not generated in the interlayer connection part 14, and the binder resin 24 exists between the interlayer connection part 14 and inner surface of the via hole 13. It is desirable that the elasticity of the binder resin 24 be lower than that of the base material 11 as described above. The reason for this is as follows.

Figure 8:
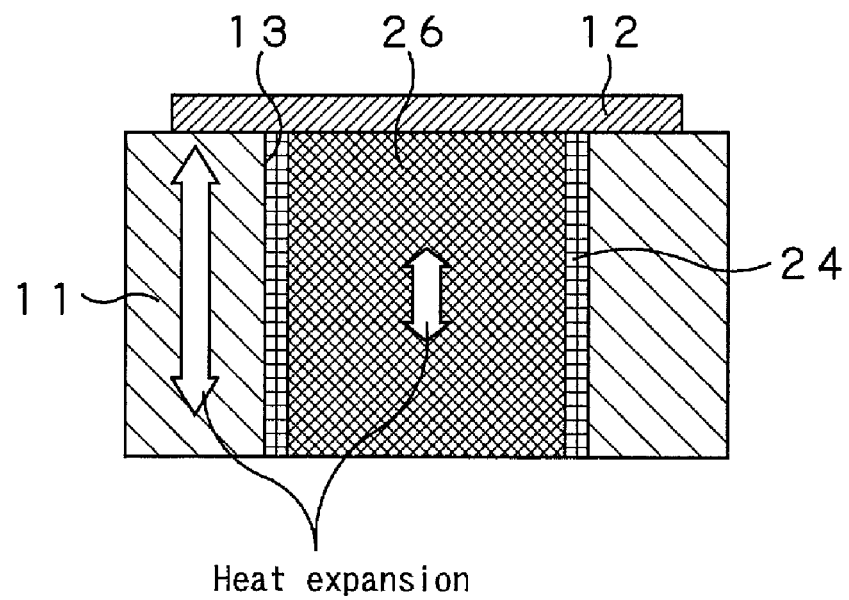
FIG. 8 is a view for comparing heat expansion coefficients between the base material and alloy in the via hole.

In general, the base material 11 which is a thermoplastic resin has a heat expansion coefficient larger than that of the alloy 26 in the via hole 13. FIG. 8 shows a heat expansion/contraction image in the Z-axis direction. Further, base material 11 and interlayer connection part 14 have a relatively high elasticity. Accordingly, a heat stress which is proportional to a product of the heat expansion coefficient and elasticity becomes large. Thus, when a heat shock is applied, fatigue of the via alloy may be generated due to a heat stress between the base material 11 and interlayer connection part 14.

However, if the binder resin 24 having an elasticity lower than that of the base material 11 exists between the base material 11 and interlayer connection part 14, the heat stress is absorbed by the binder resin 24. As a result, it is possible to control the via metal fatigue to increase reliability.

It should be understood by those skilled in the art that various modifications, combinations, sub-combinations and alternations may occur depending on design requirements and other factors insofar as they are within the scope of the appended claims or the equivalents thereof.

What is claimed is:

1. A multilayer wiring board comprising:
a plurality of metal conductor pattern layers formed on base material made of a thermoplastic resin;
a first metal containing at least copper, which has a melting point higher than the melting/bonding temperature of the base material;
a second metal containing at least tin, which is capable of alloying with the conductor pattern and which has a melting point lower than the melting/bonding temperature of the base material;
a binder resin with a melting temperature less than the melting/bonding temperature of the base material;
an interlayer electrical connection in a via hole formed between two of the plurality of conductor pattern layers; and
an intermediate layer formed on an outer wall of the interlayer electrical connection in the via hole,
wherein,
the first metal, second metal and binder resin are placed into the via hole formed in the base material,
the second metal alloys with the surfaces of the conductor patterns facing the openings of the via and the first metal, and
the interlayer electrical connection and an the intermediate layer are formed by applying heat and pressure to the multilayer wiring board while a liquefied second metal and a melted binder resin are phase separated from each other.

2. The multilayer wiring board according to claim 1, wherein the binder resin has an elasticity lower than that of the base material and an alloy of the second metal and the first metal.

3. The multilayer wiring board according to claim 1, wherein the base material is a liquid crystal polymer of a wholly aromatic polyester resin.

4. The multilayer wiring board according to claim 3, wherein the binder resin is a polyester resin.

5. The multilayer wiring board according to claim 1, wherein the conductor pattern is a metal containing at least copper.

6. The multilayer wiring board according to claim 1, wherein the content of tin constituting the low melting metal is 75 weight % to 95 weight % relative to the combined weight of the high melting metal and low melting metal.

7. The multilayer wiring board according to claim 1, wherein the content of the binder resin is 0.5 volume % to 70 volume % relative to the total volume of filler to be packed into the via hole, which contains the high melting metal and low melting metal.

8. A multilayer wiring board comprising:
a plurality of metal conductor pattern layers formed on a thermoplastic resin base material; and
an interlayer electrical connection between the metal conductors established by a via hole penetrating the base materials and an interlayer connection metal, wherein,
a first metal containing at least an alloy of tin and copper formed in the via hole connects the conductor patterns formed on the upper and lower openings of the via holes,
an intermediate layer formed between the outer circumference of the interlayer connection metal and inner surface of the via hole,
a second metal containing at least tin with a melting point lower than the melting/bonding temperature of the base material alloys with the surfaces of the conductor patterns that face the openings of the via and the first metal establish the interlayer electrical connection between the conductor patterns,
the first metal, second metal and a binder resin a with a melting temperature less than the melting/bonding temperature of the base material are placed into the via hole formed in the base material, and the interlayer electrical connection metal and the intermediate layer are formed between two of the plurality of conductor patterns by applying heat and pressure to the multilayer wiring board while a liquefied second metal and a melted binder resin are phase separated from each other.

9. The multilayer wiring board according to claim 8, wherein the binder resin has an elasticity lower than those of the base material and an alloy of the low melting metal and high melting metal.

10. The multilayer wiring board according to claim 8, wherein the base material is a liquid crystal polymer of a wholly aromatic polyester resin.

11. The multilayer wiring board according to claim 10, wherein the binder resin is a polyester resin.

12. The multilayer wiring board according to claim 8, wherein the conductor pattern is a metal containing at least copper.

* * * * *